United States Patent
Lu et al.

(10) Patent No.: US 11,165,031 B2
(45) Date of Patent: Nov. 2, 2021

(54) LAYERED METAL OXIDE FIELD EFFECT MATERIAL AND ITS APPLICATION

(71) Applicant: Yunnan University, Kunming (CN)

(72) Inventors: Zhenghong Lu, Kunming (CN); Tao Zhang, Kunming (CN); Dengke Wang, Kunming (CN)

(73) Assignee: YUNNAN UNIVERSITY, Kunming (CN)

( * ) Notice: Subject to any disclaimer, the term of this patent is extended or adjusted under 35 U.S.C. 154(b) by 224 days.

(21) Appl. No.: 16/159,452

(22) Filed: Oct. 12, 2018

(65) Prior Publication Data

US 2020/0006686 A1    Jan. 2, 2020

(30) Foreign Application Priority Data

Jun. 29, 2018 (CN) .......................... 201810695653.4

(51) Int. Cl.
| | |
|---|---|
| *H01L 51/52* | (2006.01) |
| *H01L 51/05* | (2006.01) |
| *H01L 27/32* | (2006.01) |
| *H01L 51/00* | (2006.01) |
| *H01L 51/10* | (2006.01) |
| *H01L 51/50* | (2006.01) |

(52) U.S. Cl.
CPC ........ *H01L 51/052* (2013.01); *H01L 27/3274* (2013.01); *H01L 51/0097* (2013.01); *H01L 51/0529* (2013.01); *H01L 51/105* (2013.01); *H01L 51/5012* (2013.01); *H01L 51/5056* (2013.01); *H01L 2251/303* (2013.01)

(58) Field of Classification Search
CPC .................................................. H01L 51/5296
USPC .......................................................... 257/40
See application file for complete search history.

(56) References Cited

U.S. PATENT DOCUMENTS

2014/0332769 A1* 11/2014 Lee .................... H01L 27/3272
                                                                257/40
2017/0373195 A1* 12/2017 Yamazaki ......... H01L 29/41733

* cited by examiner

*Primary Examiner* — Hsin Yi Hsieh
(74) *Attorney, Agent, or Firm* — Garvey, Smith & Nehrbass, Patent Attorneys, L.L.C.; Vanessa M. D'Souza; Seth M. Nehrbass

(57) ABSTRACT

A layered metal oxide field effect material forms a heterojunction from metal oxides with different band gaps, and defines a band gap difference ($\Delta E$)$\geq$1 eV. Band bending is generated at the interface of the heterojunction, such that a potential barrier is formed on the side with the larger band gap and a triangular potential well is formed on the side with the smaller band gap, and under the induction of a gate electric field, a polarized charge is generated at the interface of the heterojunction, and a large number of carriers are accumulated. Therefore, the present layered metal oxide field effect material has high carrier mobility higher than $10^3$ cm$^2$/V·s, and overcomes the problem that the carrier mobility of a conventional metal oxide field effect material is low, it is required to fabricate the metal oxide field effect material into a crystal phase structure with a relatively high cost, and even that a substrate thereof with a crystal phase structure is required.

15 Claims, 5 Drawing Sheets

US 11,165,031 B2

LAYERED METAL OXIDE FIELD EFFECT MATERIAL AND ITS APPLICATION

This application claims priority to Chinese patent application number 201810695653.4, filed at Jun. 29, 2018, entitled "LAYERED METAL OXIDE FIELD EFFECT MATERIAL AND ITS APPLICATION", which is incorporated herein by reference in its entirety.

TECHNICAL FIELD

The present invention relates to the field of semiconductor integrated circuit technology, and in particular to a layered metal oxide field effect material and its application.

BACKGROUND

The development level of integrated circuits has become a hallmark of a country's industrial development level. At present, the widely used semiconductor material for integrated circuits is a hydrogenated amorphous silicon material (a-Si:H), but it has low field effect mobility (about 0.5-1.0 $cm^2/V \cdot s$), poor light transmission, low carrier density and mechanical flexibility that is less than ideal, and it is not easy to be used to prepare a high-performance and flexible active matrix liquid crystal display (AMLCD), an active matrix organic light-emitting diode (AMOLED) and the like mainstream displays and flexible integrated circuits.

With the rapid development of integrated circuits, the metal oxide field effect material is widely used in the electronic industry since it has advantages such as having a simpler preparation process and a cheaper cost as compared with other materials, having uniform film formation, being capable of enabling high performance and high integration, and being capable of preparing transparent integrated circuits and flexible integrated circuits. However, the current carrier mobility of the metal oxide field effect material is still low, and less than 10 $cm^2/V \cdot s$; and in order to improve the carrier mobility of the metal oxide field effect material, it is required to fabricate the metal oxide field effect material into a crystal phase structure with a relatively high cost, and even a substrate thereof with a crystalline structure is required.

SUMMARY

The object of the present invention provides a layered metal oxide field effect material and its application. The layered metal oxide field effect material provided by the present invention has high carrier mobility.

In order to achieve the above object, the present invention provides the following technical solutions:

the present invention provides a layered metal oxide field effect material with a sandwich structure, which sequentially includes a first surface layer, a core layer and a second surface layer, the core layer being a metal oxide layer with a wide band gap, and the first surface layer and the second surface layer being metal oxide layers with narrow band gaps; and where, the band gap of the metal oxide in the core layer is ≥3 eV, the band gaps of the metal oxide in the first surface layer and the second surface layer are independently ≤3 eV, and the difference between the band gap of the metal oxide in the core layer and the band gap of the metal oxide in the first surface layer is ≥1 eV.

Preferably, the thickness of the layered metal oxide field effect material is ≤30 nm.

Preferably, the thicknesses of the first surface layer, the second surface layer and the core layer are independently ≤10 nm.

Preferably, the metal oxide in the core layer includes a binary metal oxide or a ternary metal oxide.

Preferably, the binary metal oxide includes $Al_2O_3$, $Cr_2O_3$, CaO, $Ga_2O_3$, $La_2O_3$, MnO, $Nb_2O_5$, $Nd_2O_3$, NiO, $Pr_2O_3$, $Sb_2O_3$, $Sm_2O_3$, SnO, $SnO_2$, $Ta_2O_5$, $Tb_2O_3$, $TiO_2$, ZnO, or $ZrO_2$.

Preferably, the binary metal oxide in the core layer is $Al_2O_3$.

Preferably, the ternary metal oxide includes $AlTiO_3$, $BaTiO_3$, $KNbO_3$, $KTaO_3$, $LaTi_2O_7$, $LiNbO_3$, $LiTaO_3$, $MgTiO_3$, $MnTiO_3$, $SrTiO_3$ or $ZnTiO_3$.

Preferably, the metal oxides in the first surface layer and the second surface layer independently include a binary metal oxide or a ternary metal oxide.

Preferably, the binary metal oxides includes $Ag_2O$, $Bi_2O_3$, CdO, $Ce_2O_3$, CoO, CuO, $Cu_2O$, FeO, $Fe_2O_3$, $Fe_3O_4$, HgO, $In_2O_3$, $MnO_2$, $MoO_2$, PbO, PdO, $Tl_2O_3$, $V_2O_5$ or $WO_3$.

Preferably, the binary metal oxide in the first surface layer is $MoO_2$.

Preferably, the binary metal oxide in the second surface layer is $MoO_2$.

Preferably, the ternary metal oxide includes $CdFe_2O_3$, $CoTiO_3$, $CuTiO_3$, $FeTiO_3$, $Hg_2Nb_2O_7$, $Hg_2Ta_2O_7$, $NiTiO_3$, $PbFe_{12}O_{19}$ or $YFeO_3$.

The present invention provides the application of the layered metal oxide field effect material according to any one of the above technical solutions in a field effect transistor.

The present invention provides the application of the layered metal oxide field effect material according to any one of the above technical solutions in a field effect transparent electrode.

The present invention provides the application of the layered metal oxide field effect material according to any one of the above technical solutions in driving an organic light-emitting diode.

The present invention provides the application of the layered metal oxide field effect material according to any one of the above technical solutions in the field of logic circuits, memories or flexible semiconductor integrated circuits.

The present invention provides a layered metal oxide field effect material with a sandwich structure, which sequentially includes a first surface layer, a core layer and a second surface layer, the core layer being a metal oxide layer with a wide band gap, and the first surface layer and the second surface layer being metal oxide layers of narrow band gaps; where, the band gap of the metal oxide in the core layer is ≥3 eV, the band gaps of the metal oxides in the first surface layer and the second surface layer are independently ≤3 eV, and the difference between the band gap of the metal oxide in the core layer and the band gap of the metal oxide in the first surface layer is ≥1 eV. The layered metal oxide field effect material provided by the present invention forms a heterojunction from metal oxides with different band gaps, and defines a band gap difference (ΔE)≥1 eV. Band bending is generated at the interface of the heterojunction, such that a potential barrier is formed on the side with the larger band gap and a triangular potential well is formed on the side with the smaller band gap, and under the induction of a gate electric field, a polarized charge is generated at the interface of the heterojunction, and a large number of carriers are accumulated. Therefore, the layered metal oxide field effect material provided by the present invention has high carrier mobility higher than $10^3$ cm$^2$/V·s, and overcomes the problem that the carrier mobility of a conventional metal oxide field effect material is low, it is required to fabricate the metal oxide field effect material into a crystal phase structure with a relatively high cost, and even that a substrate thereof with a crystal phase structure is required, which can be widely used in the fields of field effect transistors, field effect transparent electrodes, driving organic light-emitting diodes, logic circuits, memories or flexible semiconductor integrated circuits.

Furthermore, the layered metal oxide field effect material provided by the present invention has a thickness not more than 30 nm and thus has good light transmittance.

DETAILED DESCRIPTION

Figure 1:
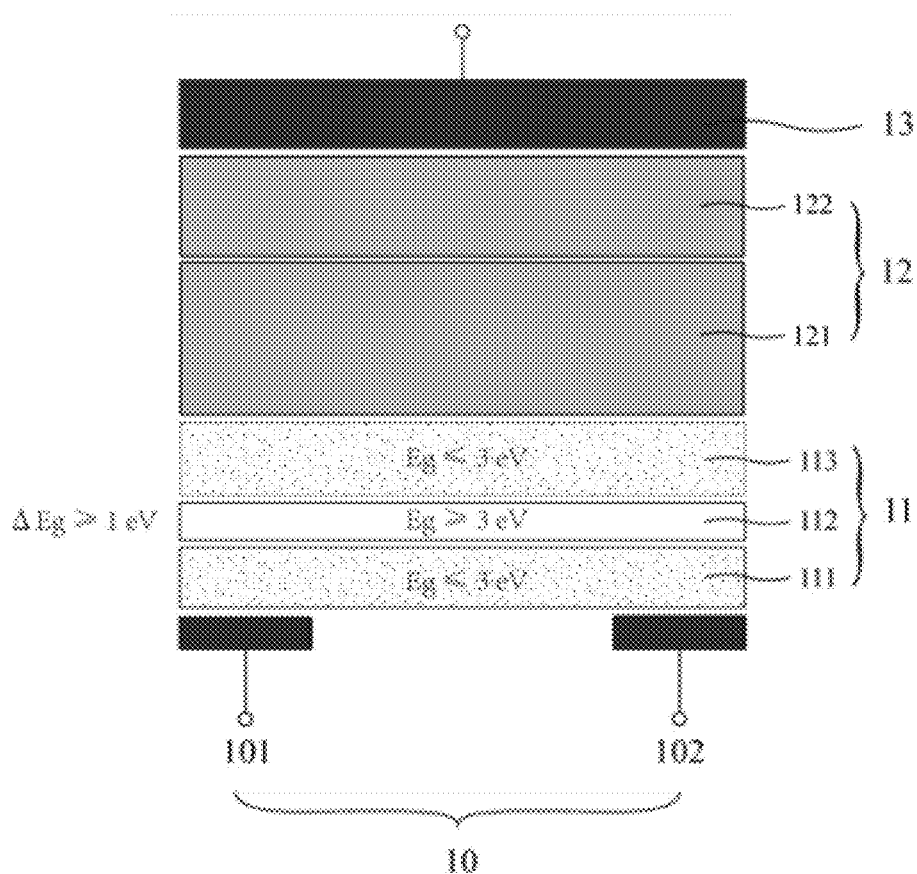
FIG. 1 is a schematic structural view of a flexible organic field effect transistor provided by the present invention.

The present invention provides a layered metal oxide field effect material with a sandwich structure, which sequentially includes a first surface layer, a core layer and a second surface layer, the core layer being a metal oxide layer with a wide band gap, and the first surface layer and the second surface layer being metal oxide layers with narrow band gaps; where, the band gap of the metal oxide in the core layer is ≥3 eV, the band gaps of the metal oxides in the first surface layer and the second surface layer are independently ≤3 eV, and the difference between the band gap of the metal oxide in the core layer and the band gap of the metal oxide in the first surface layer is ≥1 eV.

In the present invention, the thickness of the layered metal oxide field effect material is preferably ≤30 nm, more preferably 5 to 25 nm, and most preferably 10 to 15 nm.

In the present invention, the thicknesses of the first surface layer, the second surface layer and the core layer are preferably ≤10 nm, more preferably 3 to 8 nm, and most preferably 5 to 6 nm independently.

In the present invention, the core layer is a metal oxide layer with a wide band gap, and the band gap of the metal oxide in the core layer is ≥3 eV, preferably 3.5 to 7 eV, and more preferably 4 to 5 eV. In the present invention, the metal oxide in the core layer preferably includes a binary metal oxide or a ternary metal oxide; the binary metal oxide in the core layer preferably includes Al$_2$O$_3$, Cr$_2$O$_3$, CaO, Ga$_2$O$_3$, La$_2$O$_3$, MnO, Nb$_2$O$_5$, Nd$_2$O$_3$, NiO, Pr$_2$O$_3$, Sb$_2$O$_3$, Sm$_2$O$_3$, SnO, SnO$_2$, Ta$_2$O$_5$, Tb$_2$O$_3$, TiO$_2$, ZnO or ZrO$_2$, and more preferably Al$_2$O$_3$; and the ternary metal oxide in the core layer preferably includes AlTiO$_3$, BaTiO$_3$, KNbO$_3$, KTaO$_3$, LaTi$_2$O$_7$, LiNbO$_3$, LiTaO$_3$, MgTiO$_3$, MnTiO$_3$, SrTiO$_3$ or ZnTiO$_3$.

In the present invention, the type of metal oxide in the core layer and its corresponding conduction band, valence band energy level and band gap are as shown in the table below:

| The type of the metal oxide in the core layer and its corresponding conduction band, valence band energy level and band gap | | | |
|---|---|---|---|
| Metal Oxide | Conduction Band (Ec) | Valence Band Energy Level (Ev) | Band Gap (Eg) |
| Al$_2$O$_3$ | 5.4 | 12.4 | 7 |
| Cr$_2$O$_3$ | −0.57 | 2.93 | 3.5 |
| CaO | −1.09 | 3.91 | 5 |
| Ga$_2$O$_3$ | −1.55 | 3.25 | 4.8 |
| La$_2$O$_3$ | −1.97 | 3.53 | 5.5 |
| MnO | −1.01 | 2.59 | 3.6 |
| Nb$_2$O$_5$ | 0.09 | 3.49 | 3.4 |
| Nd$_2$O$_3$ | −1.63 | 3.07 | 4.7 |
| NiO | −0.5 | 3.0 | 3.5 |
| Pr$_2$O$_3$ | −1.26 | 2.64 | 3.9 |
| Sb$_2$O$_3$ | 0.32 | 3.32 | 3 |
| Sm$_2$O$_3$ | −1.43 | 2.97 | 4.4 |
| SnO | −0.91 | 3.29 | 4.2 |
| SnO$_2$ | 0 | 3.5 | 3.5 |
| Ta$_2$O$_5$ | −0.17 | 3.83 | 4 |
| Tb$_2$O$_3$ | −1.06 | 2.74 | 3.8 |
| TiO$_2$ | −0.29 | 2.91 | 3.2 |
| ZnO | −0.31 | 2.89 | 3.2 |
| ZrO$_2$ | −1.09 | 3.91 | 5 |
| SrTiO$_3$ | −1.26 | 2.14 | 3.4 |
| AlTiO$_3$ | −0.86 | 2.74 | 3.6 |
| BaTiO$_3$ | 0.08 | 3.38 | 3.3 |
| KNbO$_3$ | −0.86 | 2.44 | 3.3 |
| KTaO$_3$ | −0.93 | 2.57 | 3.5 |
| LaTi$_2$O$_7$ | −0.6 | 3.4 | 4 |
| LiTaO$_3$ | −0.95 | 3.05 | 4 |
| LiNbO$_3$ | −0.73 | 2.77 | 3.5 |
| MgTiO$_3$ | −0.75 | 2.95 | 3.7 |
| MnTiO$_3$ | −0.46 | 2.64 | 3.1 |
| ZnTiO$_3$ | −0.23 | 2.83 | 3.06 |

In the present invention, the first surface layer and the second surface layer are metal oxide layers with narrow band gaps; and the band gaps of the metal oxides in the first surface layer and the second surface layer are independently ≤3 eV, preferably 0-2.5 eV, and more preferably 1-2 eV. In the present invention, the metal oxides in the first surface layer and the second surface layer preferably include a binary metal oxide or a ternary metal oxide independently; the binary metal oxides in the first surface layer and the second surface layer preferably include Ag$_2$O, Bi$_2$O$_3$, CdO, Ce$_2$O$_3$, CoO, CuO, Cu$_2$O, FeO, Fe$_2$O$_3$, Fe$_3$O$_4$, HgO, In$_2$O$_3$, MnO$_2$, MoO$_2$, PbO, PdO, Tl$_2$O$_3$, V$_2$O$_5$ or WO$_3$, and more preferably MoO$_2$, independently; and the ternary metal oxides in the first surface layer and the second surface layer preferably include CdFe$_2$O$_3$, CoTiO$_3$, CuTiO$_3$, FeTiO$_3$, Hg$_2$Nb$_2$O$_2$, Hg$_2$Ta$_2$O$_2$, NiTiO$_3$, PbFe$_{12}$O$_{19}$ or YFeO$_3$ independently.

In the present invention, the types of metal oxides in the first surface layer and the second surface layer and their corresponding conduction bands, valence band energy levels and band gaps are as shown in the table below:

The types of metal oxides in the first surface layer and the second surface layer and their corresponding conduction bands, valence band energy levels and band gaps

| Metal Oxide | Conduction Band (Ec) | Valence Band Energy Level (Ev) | Band Gap (Eg) |
|---|---|---|---|
| $Ag_2O$ | 0.19 | 1.39 | 1.2 |
| $Bi_2O_3$ | 0.33 | 3.13 | 2.8 |
| CdO | 0.11 | 2.31 | 2.2 |
| $CdFe_2O_3$ | 0.18 | 2.48 | 2.3 |
| $Ce_2O_3$ | −0.5 | 1.9 | 2.4 |
| CoO | −0.11 | 2.49 | 2.6 |
| $CoTiO_3$ | 0.14 | 2.39 | 2.25 |
| CuO | 0.46 | 2.16 | 1.7 |
| $Cu_2O$ | −0.28 | 1.92 | 2.2 |
| $CuTiO_3$ | −0.18 | 2.81 | 2.99 |
| FeO | −0.17 | 2.23 | 2.4 |
| $Fe_2O_3$ | 0.28 | 2.48 | 2.2 |
| $Fe_3O_4$ | 1.23 | 1.33 | 0.1 |
| $FeTiO_3$ | −0.21 | 2.59 | 2.8 |
| HgO | 0.63 | 2.53 | 1.9 |
| $Hg_2Nb_2O_7$ | 0.81 | 2.61 | 1.8 |
| $Hg_2Ta_2O_7$ | 0.84 | 2.64 | 1.8 |
| $In_2O_3$ | −0.62 | 2.18 | 2.8 |
| $MnO_2$ | 1.33 | 1.58 | 0.25 |
| $MoO_2$ | | | 0 |
| $NiTiO_3$ | 0.2 | 2.38 | 2.18 |
| $PbFe_{12}O_{19}$ | 0.2 | 2.5 | 2.3 |
| PdO | 0.79 | 1.79 | 1.0 |
| $WO_3$ | 0.74 | 3.44 | 2.7 |
| $V_2O_5$ | 0.2 | 3 | 2.8 |
| $YFeO_3$ | −0.2 | 2.4 | 2.6 |

In the present invention, the difference between the band gap of the metal oxide in the core layer and the band gap of the metal oxide in the first surface layer is ≥1 eV, preferably 1.5 to 7 eV, and more preferably 2.0 to 4.0 eV.

The present invention has no special limitation on the method for preparing the layered metal oxide field effect material, and a method well known to those skilled in the art may be used, as long as the method can enable the band gap of the metal oxide of each layer in the layered metal oxide field effect material meet the aforementioned requirements.

In the present invention, a method for preparing the layered metal oxide field effect material preferably includes the following steps:

depositing a first metal oxide, a core-layer metal, and a second metal oxide sequentially on a substrate by vacuum vapor deposition, the first metal oxide and the core-layer metal undergoing a redox reaction to form a first surface layer and a core-layer precursor on the substrate, the core-layer precursor and the second metal oxide undergoing a redox reaction to form a core layer and a second surface layer.

In the present invention, the first metal oxide and the second metal oxide are preferably used in the form of a thin film, and the thicknesses of the first metal oxide and the second metal oxide are independently from 1 to 10 nm, more preferably from 2 to 7 nm, and most preferably from 3 to 5 nm.

In the present invention, the core-layer metal is preferably used in the form of a thin film, and the thickness of the core-layer metal is from 1 to 10 nm, more preferably from 2 to 7 nm, and most preferably from 3 to 5 nm.

In the present invention, the vacuum degree in the vacuum vapor deposition method is preferably $10^{-4}$ to $10^{-5}$ Pa, and the vapor-deposition distance is preferably 20 to 30 cm.

In the present invention, in the vacuum vapor deposition method the core-layer metal has the evaporation temperature which is preferably 200 to 1000° C., and more preferably 500 to 750° C.; the evaporation current which is preferably 160-180 A; and the evaporation rate which is preferably 1-2 Å/s. In the present invention, accumulation of the evaporation material on the substrate will be caused if the evaporation rate of the core-layer metal is too small and a large gap of the evaporation material on the substrate will be caused if the evaporation rate is too large.

In the present invention, in the vacuum vapor deposition method, the first metal oxide and the second metal oxide have evaporation temperatures which are preferably 500-1500° C., and more preferably 570-700° C. independently; the evaporation currents which are preferably 4 to 5 A independently; and the evaporation rates which are preferably 0.1 to 0.5 Å/s independently.

In the present invention, accumulation of the evaporation material on the substrate will be caused if the evaporation rates of the first metal oxide and the second metal oxide are too small, and a large gap of the evaporation material on the substrate will be caused if the evaporation rates are too large.

The present invention has no special limitation on the substrate, and a substrate well known to those skilled in the art may be used, particularly such as a silicon substrate or a glass substrate.

In the present invention, the purities of the first metal oxide and the second metal oxide are preferably ≥99.95% independently, and the purity of the core-layer metal is preferably ≥99.99%.

In the embodiments of the present invention, particularly a thin $MoO_3$ film (with the thickness of 2 nm), a thin Al film (with the thickness of 2 nm), and a thin $MoO_3$ film (with the thickness of 3 nm) are sequentially deposited on the substrate by vacuum vapor deposition, to form a layered metal oxide field effect material on the substrate. The layered metal oxide field effect material includes a first surface layer of $MoO_2$ (in contact with the substrate), a core layer of $Al_2O_3$, and a second surface layer of $MoO_2$. The following reaction will occur at the interface of two different materials:

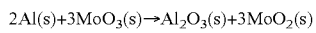

where, a redox reaction occurs at the interface between the thin $MoO_3$ film at the bottom layer and the thin Al film at the interlayer, and $MoO_3$ loses an oxygen atom to become $MoO_2$, where the valence state of molybdenum changes from +6 to +4, and the thin Al film at the interlayer is oxidized to $Al_2O_3$; and similarly, the interface between the thin $MoO_3$ film at the top layer and the thin Al film at the interlayer also undergoes a redox reaction, in which $MoO_3$ loses an oxygen atom to become $MoO_2$, where the valence state of molybdenum changes from +6 to +4, and the thin Al film at the interlayer is oxidized to $Al_2O_3$.

In chemical thermodynamics, a thermodynamic function G, called Gibbs free energy or free enthalpy, is introduced to judge the direction of the reaction. In the isothermal-isobaric reaction, if the Gibbs free energy G is negative, the positive reaction is spontaneous, otherwise the reverse reaction is spontaneous; and if it is 0, the reaction is in equilibrium. The amount of change in Gibbs free energy of the redox reaction involved in the present invention is as follows:

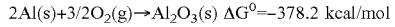
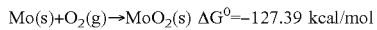
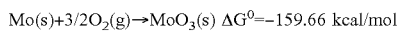

The standard Gibbs free energy in the redox reaction equation can be calculated from the redox reaction equation below:

$2Al(s) + 3MoO_3(s) \rightarrow Al_2O_3(s) + 3MoO_2(s)$ $\Delta G = -281.39$ kcal/mol since the Gibbs free energy G of the redox reaction is changed to −281.39 kcal/mol, the redox reaction proceeds spontaneously toward the positive reaction direction.

The present invention provides the application of the layered metal oxide field effect material of the above technical solution in the fields of field effect transistors, field effect transparent electrodes, driving organic light-emitting diodes, logic circuits, memories or flexible semiconductor integrated circuits. In the present invention, the field effect transistor preferably includes an organic field effect transistor, an inorganic field effect transistor, a thin film transistor, an insulated gate field effect transistor or a junction field effect transistor, more preferably an organic field effect transistor, and most preferably a flexible organic field effect transistor.

In the present invention, the flexible organic field effect transistor preferably includes a source/drain electrode 10, a layered metal oxide field effect material 11 disposed on the source/drain electrode, a gate insulation layer 12 disposed on the layered metal oxide field effect material, and a gate electrode 13 disposed on the gate insulation layer, as shown in FIG. 1.

In the present invention, the flexible organic field effect transistor preferably includes the source/drain electrode 10; the source/drain electrode 10 preferably includes a source electrode 101 and a drain electrode 102. In the present invention, the electrode material for forming the source electrode and the drain electrode preferably includes a metal conductive material or a metal oxide conductive material independently; the metal conductive material preferably includes Ag, Cu, Au, Al, W, Ni, Ti, Zn, Cr or Mo; and the metal oxide conductive material preferably includes indium tin oxide (ITO), indium zinc oxide (IZO) or SnO. In the embodiments of the present invention, particularly Al is used as the electrode material for forming the source electrode and the drain electrode.

In the present invention, the flexible organic field effect transistor preferably includes the layered metal oxide field effect material 11 disposed on the source/drain electrode. In the present invention, it is only required that the surface layer of the layered metal oxide field effect material is in contact with the source/drain electrodes, and for example the first surface layer or the second surface layer of the layered metal oxide field effect material is in contact with the source/drain electrode. In the embodiments of the present invention, the layered metal oxide field effect material 11 particularly includes a first surface layer 111, a core layer 112, and a second surface layer 113, where the first surface layer 111 is in contact with the source/drain electrodes. In the present invention, the layered metal oxide field effect material is used as a P-channel material in the flexible organic field effect transistor; and in the embodiments of the present invention, the channel has a length of particularly 6 mm, and a width of particularly 16 mm.

In the present invention, the flexible organic field effect transistor preferably includes the gate insulation layer 12 disposed on the layered metal oxide field effect material. In the present invention, the gate insulation layer preferably includes an organic light-emitting layer 121 and a hole transport layer 122 disposed on the organic light-emitting layer. In the present invention, the thickness of the organic light-emitting layer is preferably 50 to 60 nm, and the thickness of the hole transport layer is preferably 40 to 45 nm. The present invention has no special limitation on the organic light-emitting material used for forming the organic light-emitting layer and the hole transport material used for forming the hole transport layer, and the organic light-emitting material and the hole transport material well known to those skilled in the art may be used. In the embodiments of the present invention, particularly tris (8-hydroxyquinolinato) aluminum ($Alq_3$) is used as the organic light-emitting material, and N,N'-bis(1-naphthyl)-N,N'-diphenyl-1,1'-biphenyl-4-4'-diamine (NPB) is used as the hole transport material.

In the present invention, it is only required that the gate insulation layer is in contact with the surface layer of the layered metal oxide field effect material, and for example the gate insulation layer is in contact with the first surface layer or the second surface layer of the layered metal oxide field effect material. In the embodiments of the present invention, particularly the organic light-emitting layer 121 of the gate insulation layer is in contact with the second surface layer 113 of the layered metal oxide field effect material.

In the present invention, the flexible organic field effect transistor preferably includes a gate electrode 13 disposed on the gate insulation layer. The present invention has no special limitation on the gate material used to form the gate electrode, and an electrode material well known to those skilled in the art may be used. In the embodiments of the present invention, particularly Al is used as the electrode material for forming the gate electrode.

The technical solutions in the present invention will be clearly and completely described below in connection with the Examples of the present invention. Obviously, the described Examples are only part of the Examples of the present invention, not all of the embodiments. Based on the embodiments of the present invention, all other Examples obtained by those of ordinary skills in the art on the premise of not paying creative labor belong to the claimed scope of the present invention.

Example 1

A thin $MoO_3$ film (with a purity of 99.95%, and a thickness of 2 nm), a thin Al film (with a purity of 99.99%, and a thickness of 2 nm), and a thin $MoO_3$ film (with a purity of 99.95%, and a thickness of 3 nm) were sequentially deposited on a silicon substrate by vacuum vapor deposition, so as to form a layered metal oxide field effect material on the silicon substrate. The layered metal oxide field effect material included a first surface layer 111 of $MoO_2$ (with a thickness of 2 nm, being in contact with the silicon substrate), a core layer 112 of $Al_2O_3$ (with a thickness of 2 nm), and a second surface layer 113 of $MoO_2$ (with a thickness of 3 nm), where the operating parameters for depositing the thin Al film were: a vacuum degree of $10^{-5}$ Pa, a vapor-deposition distance of 30 cm, an evaporation temperature of 750° C., an evaporation current of 180 A, and an evaporation rate of 1 Å/s; and the operating parameters for depositing the $MoO_3$ film were: a vacuum degree of $10^{-5}$ Pa, a vapor-deposition distance of 30 cm, an evaporation temperature of 570° C., an evaporation current of 4.5 A, and an evaporation rate of 0.5 Å/s.

Figure 2:
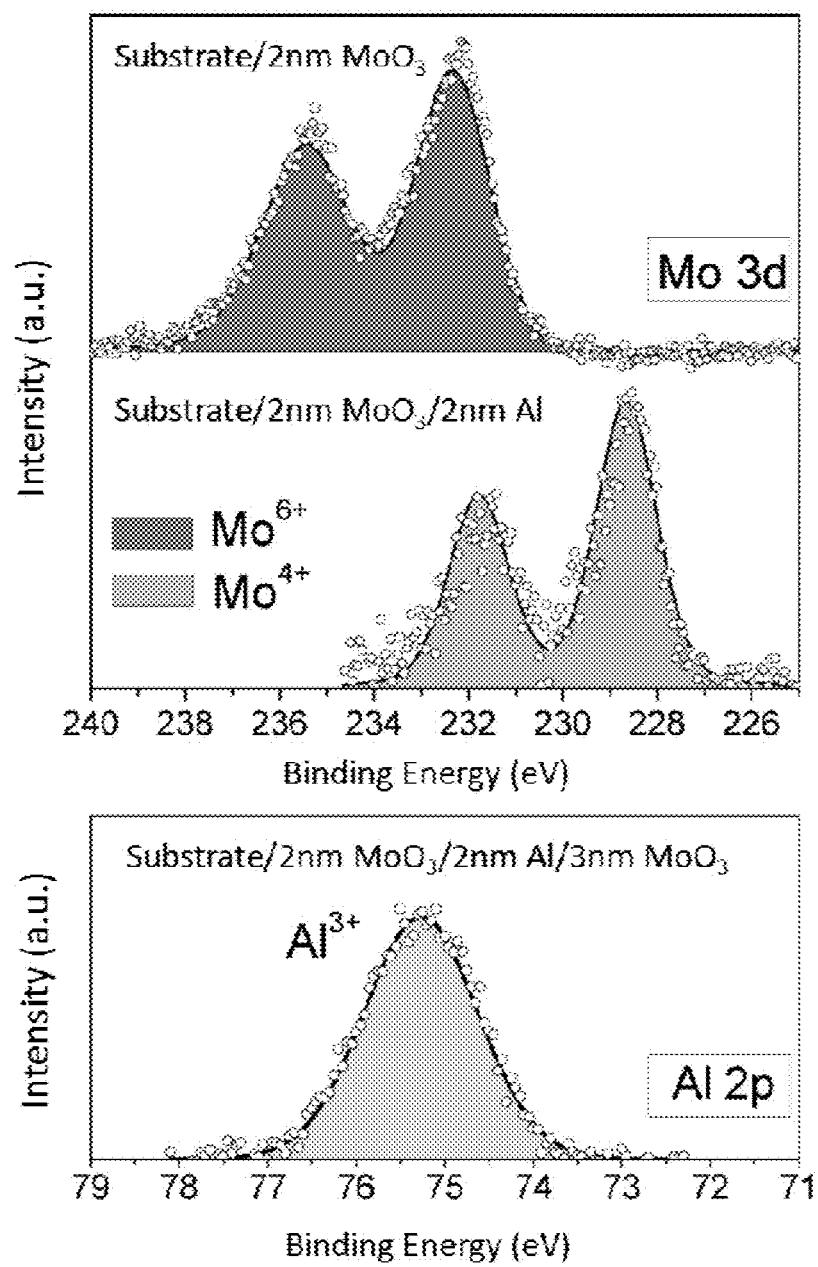
FIG. 2 is an X-ray photoelectron spectroscopy diagram of the layered metal oxide field effect material prepared in Example 1.

In order to demonstrate the valence structures of respective substances in the layered metal oxide field effect material, X-ray photoelectron spectroscopy analysis was performed on the layered metal oxide field effect material, and the result was as shown in FIG. 2. FIG. 2 was a Mo 3d and Al 2p core ultraviolet X-ray photoelectron spectroscopy of samples at different stages of the layered metal oxide field effect material deposited on the silicon substrate (the deposited raw materials were the thin $MoO_3$ film (2 nm), the thin $MoO_3$ film (2 nm)/the thin Al film (2 nm), the thin $MoO_3$ film (2 nm)/the thin Al film (2 nm)/the thin $MoO_3$ film (3 nm) respectively. It could be seen from FIG. 2, the result of the spontaneous redox chemical reaction at the interface was that a structure of $Mo^{4+}/Al^{3+}/Mo^{4+}$ was formed in the layered metal oxide field effect material.

Figure 3:
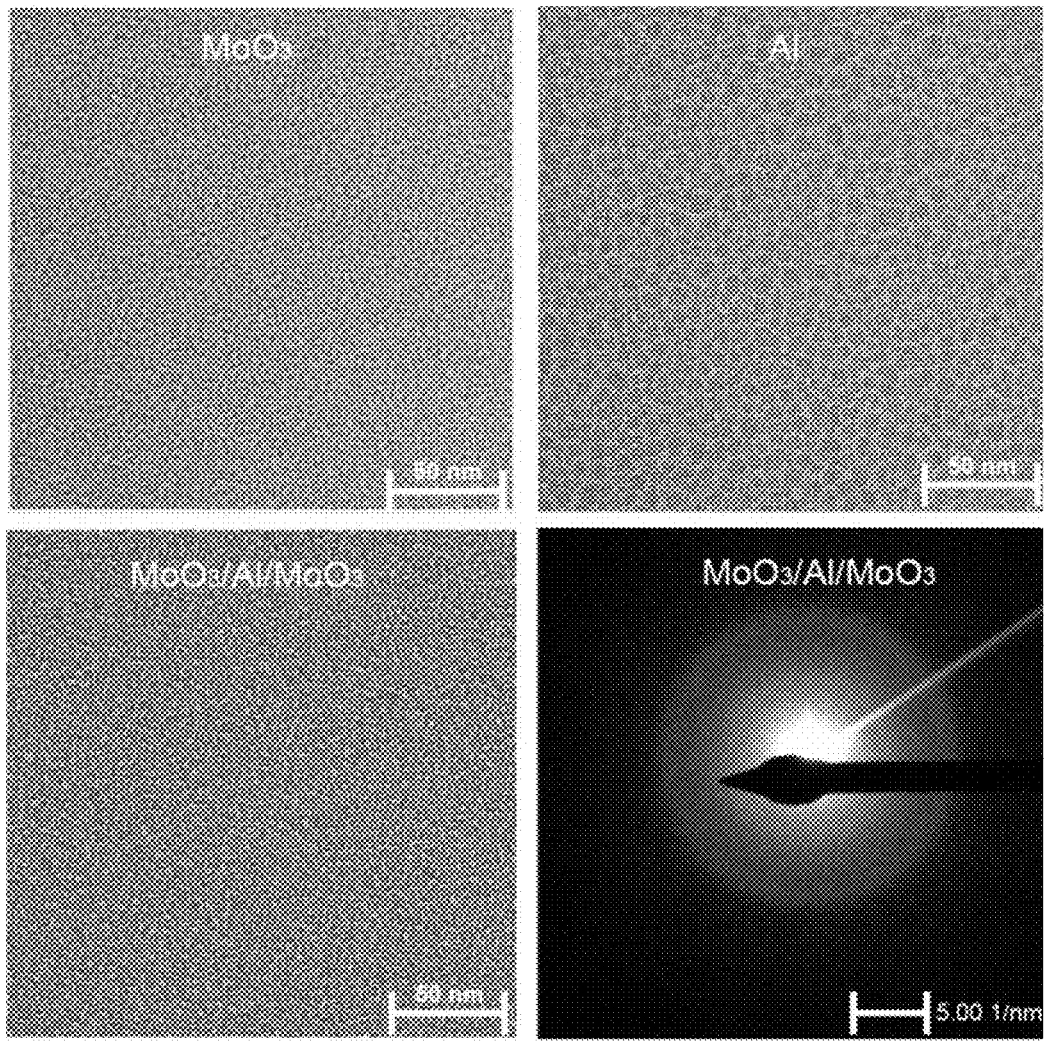
FIG. 3 is a transmission electron micrograph of the layered metal oxide field effect material prepared in Example 1, a single thin MoO$_3$ film, and a thin Al film, and a transmission electron microscope diffraction pattern of the layered metal oxide field effect material.

In order to compare topographic characteristics of a single thin film and the layered metal oxide field effect material, the thin $MoO_3$ film and the thin Al film were deposited on formvar stabilized with carbon support films under the same conditions to form a flat thin film with an amorphous structure, and the result was as shown in FIG. 3. FIG. 3 was the transmission electron micrographs of the layered metal oxide field effect material (the raw materials are the thin $MoO_3$ film (2 nm)/the thin Al film (2 nm)/the thin $MoO_3$ film (3 nm)) prepared in Example 1, a single thin $MoO_3$ film (the raw material was the thin $MoO_3$ film (2 nm)) and the thin Al film (the raw material was the thin Al film (2 nm)), and the transmission electron microscope diffraction pattern of the layered metal oxide field effect material. As can be seen from FIG. 3, the single thin Al film and the thin $MoO_3$ film were uniformly deposited on the formvar stabilized with carbon support films, and the layered metal oxide field effect material also had a uniform and flat surface structure, and one layer of an amorphous thin film structure was formed because the substrate was not heated.

Example 2

Figure 4:
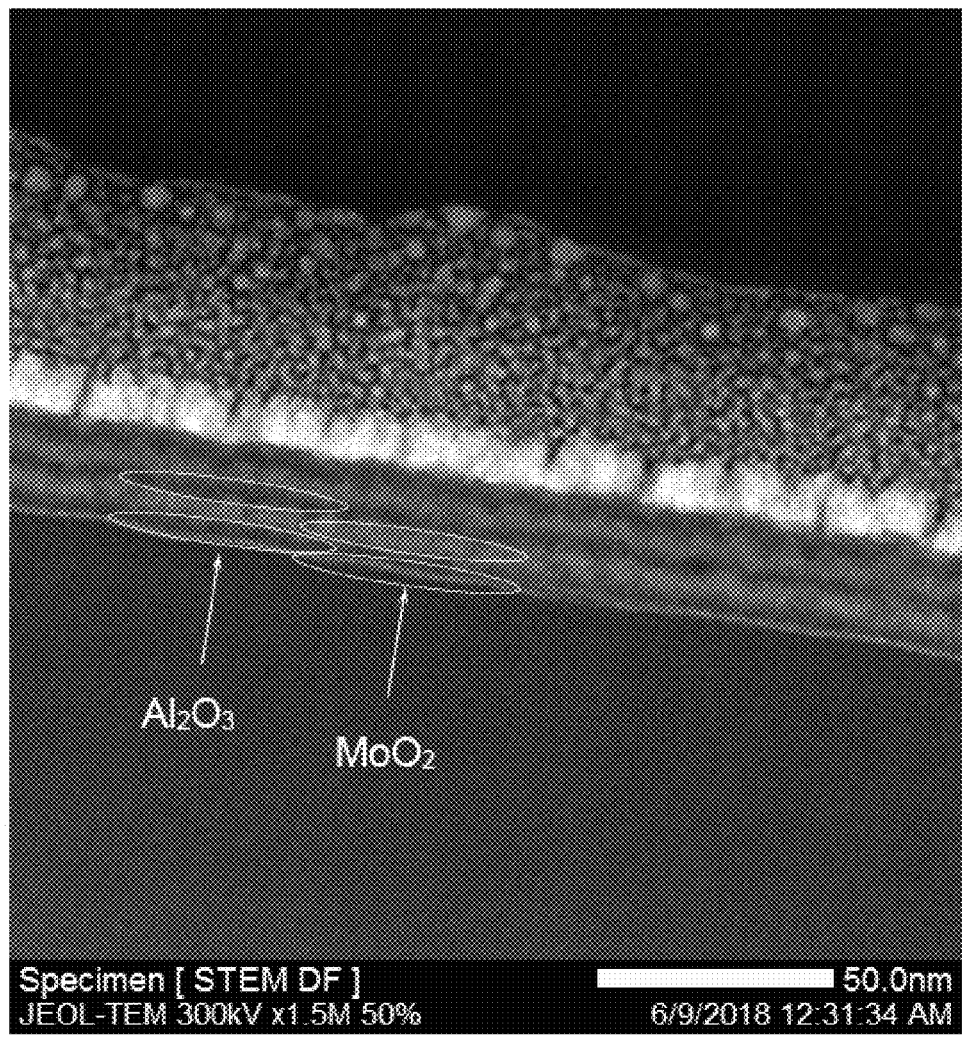
FIG. 4 is a cross-sectional STEM diagram of the multi-layer layered metal oxide field effect material prepared in Example 2.

In order to verify the interface stacking characteristics of the layered metal oxide field effect material provided by the present invention, a multilayer layered metal oxide field effect material $MoO_2(2$ nm$)/Al_2O_3(2$ nm$)/MoO_2(4$ nm$)/Al_2O_3(2$ nm$)/MoO_2(4$ nm$)/Al_2O_3(2$ nm$)/MoO_2(4$ nm$)$ was prepared according to the method of Example 1. FIG. 4 was a cross-sectional STEM image of the multilayer layered metal oxide field effect material prepared in this example. It could be seen from FIG. 4, the interface between the thin $MoO_2$ film and the thin $Al_2O_3$ film exhibited a distinct interface (white represented $MoO_2$ film, and gray black represented the thin $Al_2O_3$ film).

Example 3

The layered metal oxide field effect material prepared in Example 1 was used as a P-channel material (with a channel length set as 6 mm, and a width set as 16 mm) to prepare a flexible organic field effect transistor. In particular, the source electrode 101 and the drain electrode 102 were disposed under the first surface layer 111 of $MoO_2$ (the source electrode and the drain electrode were formed of Al), the organic light-emitting layer 121 (formed by $Alq_3$ and having a thickness of 60 nm) was disposed over the second surface layer 113 of $MoO_2$, the hole transport layer 122 (formed by NPB and having a thickness of 45 nm) was disposed on the organic light-emitting layer 121, and the gate electrode 13 (formed of Al) was disposed on the hole transport layer 122.

Example 4

The flexible organic field effect transistor prepared in Example 3 was tested for its performance, the test was particularly as follows:

A HP-4140B picoammeter/DC voltage power was used to output a constant voltage to the gate of the flexible organic field effect transistor, and another HP-4140B picoammeter/DC voltage power was used to output voltage to the source electrode and the drain electrode of the flexible organic field effect transistor. Under different constant gate voltage outputs, through software control, the voltage output to the source electrode and the drain electrode of the organic field effect transistor was enabled to rise stepwise, and meanwhile the values of the current passing through the source and drain electrodes were measured synchronously, to output real-time voltage-current values on a computer.

Figure 5:
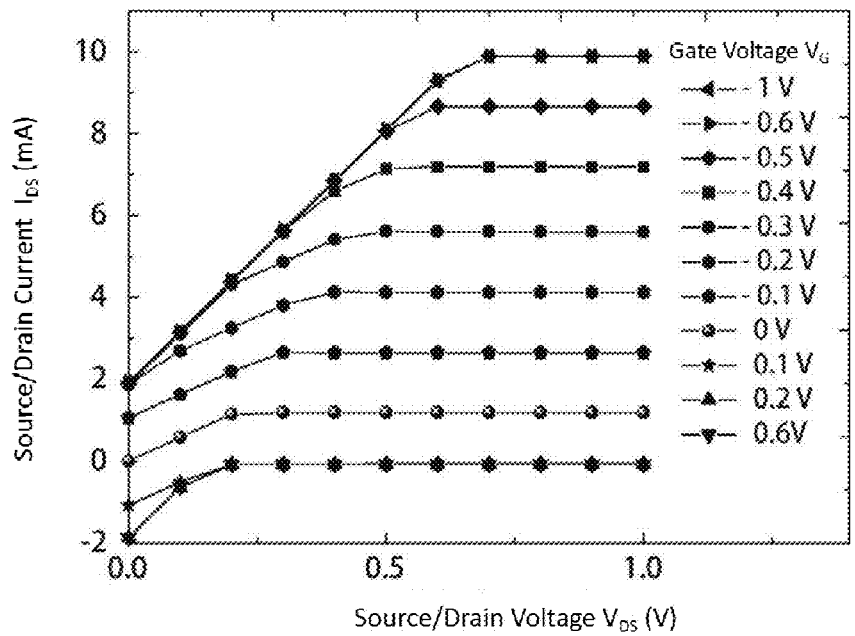
FIG. 5 is an output characteristic diagram of the flexible organic field effect transistor prepared in Example 3.

FIG. 5 is a diagram showing the output characteristics of the flexible organic field effect transistor. It can be seen from FIG. 5 that when the gate voltage is zero, the source/drain voltage $V_{DS}$ is 0.2 V, and the source/drain current $I_{DS}$ is saturated at about 1 mA, which is very small. When a positive voltage is applied to the gate, the source/drain current $I_{DS}$ quickly becomes 0, indicating that the layered metal oxide field effect material is a P-type semiconductor material for transporting holes, and the flexible organic field effect transistor has a P-type unipolar conductance characteristic. When a negative voltage is applied to the gate, the carrier concentration at the interface between the layered metal oxide field effect material and the organic light-emitting layer increases, the source/drain current $I_{DS}$ increases, and as the gate voltage increases, a significant field effect transistor characteristic relationship appears between the source/drain voltage Vas and the source/drain current $I_{DS}$. The source/drain voltage Vas is in a range of less than 0.6 V, the $I_{DS}$ increases along with the increase of Vas, and the $I_{DS}$-$V_{DS}$ has a linear relationship, which indicates that the layered metal oxide field effect material provided by the present invention forms a good ohmic contact with the source/drain aluminum electrodes.

Figure 6:
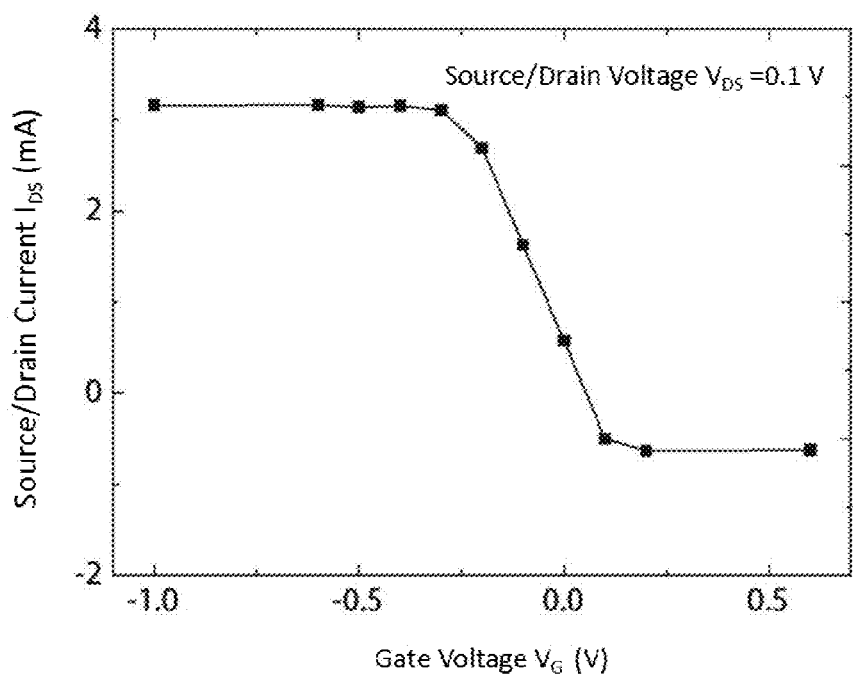
FIG. 6 is a transfer characteristic diagram of the flexible organic field effect transistor prepared in Example 3.

FIG. 6 is a transfer characteristic diagram of the flexible organic field effect transistor. It can be seen from FIG. 6 that, in absence of the gate voltage, the layered metal oxide field effect material has a large sheet resistance of approximately $10^4 \Omega/\square$ as tested by a surface resistance tester (model: RTS-9), and thus can be regarded as an insulator. When the gate voltage $V_G$ is increased, the top and bottom surfaces of the layered metal oxide field effect material generate an induced charge, and the core layer is an oxide material with a wide band gap, such that the carriers in the layered metal oxide field effect material are confined in the narrow-band-gap oxide of the top and bottom surfaces, forming a two-dimensional hole gas. When an external electric field is applied between the source and drain electrodes, the channel current $I_D$ can be detected. The carrier concentration can be controlled by changing the gate voltage $V_G$.

The carrier mobility is calculated as follows:

$$\mu = \frac{hL_{ch}g_m}{\varepsilon_r\varepsilon_0 dV_{DS}}$$

where, $\mu$ is the carrier mobility, h is the thickness of the gate insulation layer, $L_{ch}$ is the channel length, d is the channel width, $\varepsilon_r$ is the relative dielectric constant of the gate insulation layer (in NPB), $\varepsilon_0$ is the vacuum dielectric constant, and $g_m$ is the transconductance.

In this embodiment, h=105 nm, $L_{ch}$=6 mm, d=16 mm, $\varepsilon_r$=$1.7^2$ (in NPB), $\varepsilon_0$=$8.85\times10^{-12}$ F/m, and $g_m$=8.44 mA/V (which is the slope of the $I_{DS}$-$V_G$ curve).

As calculated by the above equation, $\mu$ is about $10^5$ $cm^2/V\cdot s$.

It can be seen from the above embodiments that the layered metal oxide field effect material provided by the present invention has high carrier mobility higher than $10^3$ cm$_2$/V·s, and thus overcomes the problem that the conventional metal oxide field effect material has low carrier mobility, and thus it is required to fabricate it into a crystal phase structure having a relatively high cost, and even that a substrate having a crystal phase structure is required.

PARTS LIST 10 source/drain electrode
11 layered metal oxide field effect material
12 gate insulation layer
13 gate electrode
101 source electrode
102 drain electrode
111 first surface layer of layered metal oxide field effect material
112 core layer of layered metal oxide field effect material
113 second surface layer of layered metal oxide field effect material
121 organic light-emitting layer of the gate insulation layer
122 hole transport layer

LISTING OF ACRONYMS AND ABBREVIATIONS

° C. degrees Celsius
A amp
Å angstrom
Ag silver
Al aluminum
Alq$_3$ tris (8-hydroxyquinolinato) aluminum
AM LCD active matrix liquid crystal display
AMOLED active matrix organic light-emitting diode
Au gold
a-Si:H hydrogenated amorphous silicon
Ba barium
Bi bismuth
Ca calcium
Cd cadmium
Ce cerium
CM centimeter
cm$^2$ square centimeters
Co cobalt
Cr Chromium
Cu copper
d channel width
Ec conduction band
Eg band gap
eV electron volt
Ev valence band energy level
Fe iron
G Gibbs free energy/free enthalpy
Ga gallium
g$_m$ transconductance
h thickness of the gate insulation layer
H hydrogen
Hg mercury
I$_D$ channel current
I$_{DS}$ source/drain current
In indium
ITO indium tin oxide
IZO indium zinc oxide
K potassium
kcal kilocalorie
La lanthanum
L$_{ch}$ channel length
Li Lithium
mA milliamp
Mg magnesium
mm millimeter
Mn manganese
Mo molybdenum
mol mole
Nb niobium
Nd neodymium
Ni nickel
nm nanometer
NPB N,N'-bis(1-naphthyl)-N,N'-diphenyl-1,1'-biphenyl-4-4'-diamine
O oxygen
Pa pascal
Pb lead
Pd Palladium
Pr praseodymium
s second
Sb antimony
Si silicon
Sm samarium
Sn tin
Sr strontium
STEM scanning transmission electron microscopy
Ta tantalum
Tb terbium
Ti titanium
Tl thallium
vanadium
volt
V$_{DS}$ source/drain voltage
V$_G$ gate voltage
W tungsten
Y Yttrium
Zn zinc
Zr zirconium
ΔE change in energy
ΔG change in Gibbs free energy
ΔG$^0$ Gibbs
ε$_0$ vacuum dielectric constant
ε$_r$ relative dielectric constant of the gate insulation layer (in NPB)
μ carrier mobility
Ω/□ ohm per square (sheet resistance)

The above description is only preferred embodiments of the present invention, and it should be noted that several improvements and modifications can also be made by those skilled in the art without departing from the principles of the present invention, these improvements and modifications should also be regarded as in the claimed scope of the present invention.

What is claimed is:

1. A layered metal oxide field effect material with a sandwich structure which sequentially comprises a first surface layer, a core layer and a second surface layer, the core layer being a metal oxide layer with a wide band gap, the first surface layer and the second surface layer being metal oxide layers with narrow band gaps; wherein, the band gap of the metal oxide in the core layer is ≥3 eV, the band gaps of the metal oxides in the first surface layer and the second surface layer are independently ≤3 eV, and a difference between the band gap of the metal oxide in the core layer and the band gap of the metal oxide in the first surface layer is ≥1 eV;

wherein the metal oxide in the first surface layer is $MoO_2$; and wherein the metal oxide in the second surface layer is $MoO_2$.

2. The layered metal oxide field effect material according to claim 1, wherein a thickness of the layered metal oxide field effect material is ≤30 nm.

3. The layered metal oxide field effect material according to claim 1, wherein a thickness of the first surface layer, the second surface layer and the core layer are independently ≤10 nm.

4. The layered metal oxide field effect material according to claim 2, wherein a thickness of the first surface layer, the second surface layer and the core layer are independently ≤10 nm.

5. The layered metal oxide field effect material according to claim 1, wherein the metal oxide in the core layer comprises a binary metal oxide.

6. The layered metal oxide field effect material according to claim 5, wherein the binary metal oxide comprises $Al_2O_3$, $Cr_2O_3$, CaO, $Ga_2O_3$, $La_2O_3$, MnO, $Nb_2O_5$, $Nd_2O_3$, NiO, $Pr_2O_3$, $Sb_2O_3$, $Sm_2O_3$, SnO, $SnO_2$, $Ta_2O_5$, $Tb_2O_3$, $TiO_2$, ZnO or $ZrO_2$.

7. The layered metal oxide field effect material according to claim 5, wherein the binary metal oxide in the core layer is $Al_2O_3$.

8. The layered metal oxide field effect material according to claim 5, wherein the ternary metal oxide comprises $AlTiO_3$, $BaTiO_3$, $KNbO_3$, $KTaO_3$, $LaTi_2O_7$, $LiNbO_3$, $LiTaO_3$, $MgTiO_3$, $MnTiO_3$, $SrTiO_3$ or $ZnTiO_3$.

9. The application of the layered metal oxide field effect material according to claim 1 in a field effect transistor.

10. The application of the layered metal oxide field effect material according to claim 2 in a field effect transistor.

11. The application of the layered metal oxide field effect material according to claim 1 in a field effect transparent electrode.

12. The application of the layered metal oxide field effect material according to claim 2 in a field effect transparent electrode.

13. The application of the layered metal oxide field effect material according to claim 1 in driving an organic light-emitting diode.

14. The application of the layered metal oxide field effect material according to claim 2 in driving an organic light-emitting diode.

15. The application of the layered metal oxide field effect material according to claim 1 in the fields of logic circuits, memories or flexible semiconductor integrated circuits.

* * * * *